US010177173B2

United States Patent
Fan et al.

(10) Patent No.: US 10,177,173 B2
(45) Date of Patent: Jan. 8, 2019

(54) TOUCH DRIVE CIRCUIT AND DRIVING METHOD THEREFOR, AND ARRAY SUBSTRATE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Jun Fan, Beijing (CN); Fuqiang Li, Beijing (CN); Fei Huang, Beijing (CN); Yun Qiao, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 113 days.

(21) Appl. No.: 15/304,951

(22) PCT Filed: Dec. 11, 2015

(86) PCT No.: PCT/CN2015/097095
§ 371 (c)(1),
(2) Date: Oct. 18, 2016

(87) PCT Pub. No.: WO2016/188093
PCT Pub. Date: Dec. 1, 2016

(65) Prior Publication Data
US 2017/0186773 A1 Jun. 29, 2017

(30) Foreign Application Priority Data
May 27, 2015 (CN) .......................... 2015 1 0280372

(51) Int. Cl.
*H01L 27/12* (2006.01)
*G06F 3/041* (2006.01)
*G06F 3/044* (2006.01)

(52) U.S. Cl.
CPC ............ *H01L 27/124* (2013.01); *G06F 3/044* (2013.01); *G06F 3/0412* (2013.01); *G06F 3/0416* (2013.01); *G06F 2203/04103* (2013.01)

(58) Field of Classification Search
CPC ......... G06F 3/0416; G06F 2203/04103; H01L 27/124
See application file for complete search history.

(56) References Cited

U.S. PATENT DOCUMENTS

2013/0181942 A1   7/2013  Bulea et al.
2014/0253498 A1*  9/2014  Suzuki ................... G06F 3/044
                                              345/174
(Continued)

FOREIGN PATENT DOCUMENTS

CN          103400601 A          11/2013
CN          104360781 A           2/2015
(Continued)

OTHER PUBLICATIONS

First Chinese Office Action dated Apr. 28, 2017; Appln. No. 201510280372.9.
International Search Report and Written Opinion dated Mar. 1, 2016; PCT/CN2015/097095.

*Primary Examiner* — Ryan A Lubit
(74) *Attorney, Agent, or Firm* — Ladas & Parry LLP

(57) ABSTRACT

A touch drive circuit and a driving method therefor, an array substrate and a touch display apparatus relate to a field of display. The driving method includes: during touch scanning time period in one frame, by each of output control unit (2), receiving a touch enable signal, a common voltage signal and a touch scanning signal, and receiving an output signal (Continued)

of an shift register unit connected with the output control unit; and outputting, by each of the output control units, the touch scanning signal to a touch drive electrode connected with the touch control unit in a first time period according to the touch enable signal and the output signal of the shift register unit connected with the output control unit, wherein the first time period is scanning time allocated to the touch drive electrode in one frame of time.

18 Claims, 3 Drawing Sheets

(56) References Cited

U.S. PATENT DOCUMENTS

| | | | |
|---|---|---|---|
| 2014/0355732 A1 | 12/2014 | Lin et al. | |
| 2015/0355767 A1* | 12/2015 | Abe | G06F 3/0412 |
| | | | 345/174 |
| 2016/0132170 A1 | 5/2016 | Zhang et al. | |
| 2016/0188091 A1* | 6/2016 | Sun | G06F 3/044 |
| | | | 345/174 |
| 2017/0364203 A1* | 12/2017 | Azumi | G06F 3/0416 |

FOREIGN PATENT DOCUMENTS

| | | |
|---|---|---|
| CN | 204166519 A | 2/2015 |
| CN | 104537972 A | 4/2015 |
| CN | 104834427 A | 8/2015 |

* cited by examiner

TOUCH DRIVE CIRCUIT AND DRIVING METHOD THEREFOR, AND ARRAY SUBSTRATE

TECHNICAL FIELD

Embodiments of the present disclosure relate to a field of display, and particularly, to a touch drive circuit and a driving method therefor, an array substrate and a touch display apparatus.

BACKGROUND

An in cell touch display screen integrates a touch function and a display function, and according to different principles of achieving the touch function thereof, the in cell touch display screen can be divided into a resistive touch display screen and a capacitive touch display screen and the like, wherein the touch function of the capacitive touch display screen is achieved by sensing a human body current. Currently, a common capacitive touch display screen includes an array substrate and a color filter substrate; a plurality of electrodes (referred to as touch drive electrodes) arranged along an X direction are laid out on the array substrate; a plurality of electrodes (referred to as touch sense electrodes) arranged along a Y direction are laid out on the color filter substrate, wherein the Y direction is perpendicular to the X direction; and capacitors (node capacitors) are formed at nodes where the touch drive electrodes and the touch sense electrodes intersect with each other. In the operating process, each touch drive electrode sequentially loads a high-frequency current signal, and meanwhile, a current flowing out of each touch sense electrode is monitored in real time. When a finger is in contact with a certain position on a screen, a coupling capacitor can be formed between the finger and the screen at the position, and the current flowing out of the corresponding touch sense electrode can be changed. A processor monitors a current change condition of each touch sense electrode and determines coordinates of the node capacitor of which the current is changed so as to determine the position of a touch point. In order to sense the touch point of the finger, a great number of node capacitors needs to be arranged, so that a great number of touch drive electrodes are required.

In the prior art, a drive chip outputs the high-frequency current signals to the touch drive electrodes by leads; since the drive chip is independent of the array substrate, the leads need to pass through the edge of the touch display screen, and when there are a great number of the touch electrodes, there will be a great number of leads on the edge of the touch display screen and a narrow frame design is difficult to achieve.

SUMMARY

The present disclosure provides a touch drive circuit and a driving method therefor, an array substrate and a touch display apparatus, which can decrease the number of leads on the edge of the touch display apparatus, and facilitate achieving a narrow frame.

In order to fulfill such aim, embodiments of the present disclosure adopt the technical solutions in the following:

In a first aspect of the present disclosure, there is provided a touch drive circuit arranged on the array substrate, the touch drive circuit includes a plurality of shift register units mutually cascaded and further includes a plurality of output control units; an output terminal of the shift register unit at each stage is connected to one touch drive electrode through one output control unit, and each touch drive electrode includes one or more common electrodes; and each of the output control units receives a touch enable signal, a common voltage signal, a touch scanning signal and an output signal of the shift register unit connected with the output control unit, and under the control of the touch enable signal and the output signal, outputs the touch scanning signal to the touch drive electrode connected with the output control unit in a first time period, and the first time period is scanning time allocated to the touch drive electrode in one frame of time.

From the above, when the touch drive circuit arranged on the array substrate, as provided by the present disclosure, operates, a drive chip is connected to the touch drive circuit only through a small number of leads, and the small number of leads are used for transmitting the touch scanning signals, control signals for the shift register units and control signals for the output control units to the touch drive circuit, so that an operation of scanning the touch drive electrodes is implemented, and compared with a practice in the prior art that the drive chip is connected to the touch drive circuit through a great number of leads and each lead is used for outputting a drive signal to one touch drive electrode, the number of signals required in the operating process of the touch drive circuit is far less than that of the touch drive electrodes, and thus, the technical solution of the present disclosure decreases the number of the leads for the scanning process of the touch drive electrodes so as to decrease the number of the leads on the edge of the touch display apparatus, reduce a space occupied by the leads on the edge of the touch display apparatus and facilitate achieving the narrow frame.

In addition, each touch drive electrode includes one or more common electrodes, and when each touch drive electrode operates, the touch scanning signal is loaded in the corresponding first time period in one frame, and in time periods in said frame except the corresponding first time period, the common voltage signal is loaded, so that the common electrode corresponding to each touch electrode is not only used for achieving the display function, but also used for achieving the touch function, thereby saving a step of producing the touch drive electrodes and benefiting for reducing cost, improving product yield and improving production efficiency.

In a second aspect of the present disclosure, there is further provided a driving method for the touch drive circuit, said driving method includes: during touch scanning time period in one frame, by each of the output control units, receiving a touch enable signal, a common voltage signal and a touch scanning signal, and receiving an output signal of the shift register unit connected with the output control unit; and according to the touch enable signal and the output signal, outputting, by each of the output control units, the touch scanning signal to touch drive electrode connected with the touch control unit in a first time period, wherein the first time period is scanning time allocated to the touch drive electrode in one frame of time.

In the driving method for the touch drive circuit, in the touch scanning time period, the shift register units further receive an initial shift signal, and are gated stage by stage after receiving the initial shift signal.

In the driving method for the touch drive circuit, in the touch scanning time period, the shift register units also receive forward scanning control signal and reverse scanning control signal, and enter a forward scanning mode or a reverse scanning mode under the control of the forward scanning control signal and the reverse scanning control signal; in the forward scanning mode, after the shift register unit at a first stage receives the initial shift signal, gating is sequentially performed from the shift register unit at the lowest stage to the shift register unit at the highest stage; and in the reverse scanning mode, after the shift register unit at a last stage receives the initial shift signal, gating is sequentially performed from the shift register unit at the highest stage to the shift register unit at the lowest stage.

In a third aspect of the present disclosure, there is further provided an array substrate which includes any one of the touch drive circuits described above.

In a fourth aspect of the present disclosure, there is further provided a touch display apparatus, and the touch display apparatus is provided with the array substrate.

The touch driving method, the array substrate and the touch display apparatus which are provided by the present disclosure all have the same advantageous effects with the touch drive circuit, which is not repeated herein.

BRIEF DESCRIPTION OF THE DRAWINGS

In order to clearly illustrate the technical solution of the embodiments of the present disclosure, accompanying drawings of the embodiments will be briefly described in the following; it is obvious that the described drawings are only some embodiments of the present disclosure, and based on the described embodiments herein, those skilled in the art can obtain other drawing(s) without any inventive work.

DETAILED DESCRIPTION

The technical solutions of the embodiments of the present disclosure will be described in a clearly and fully understandable way in connection with the drawings related to the embodiments of the present disclosure. It is obvious that the described embodiments are just a part but not all of the embodiments of the present disclosure.

First Embodiment

Figure 1:
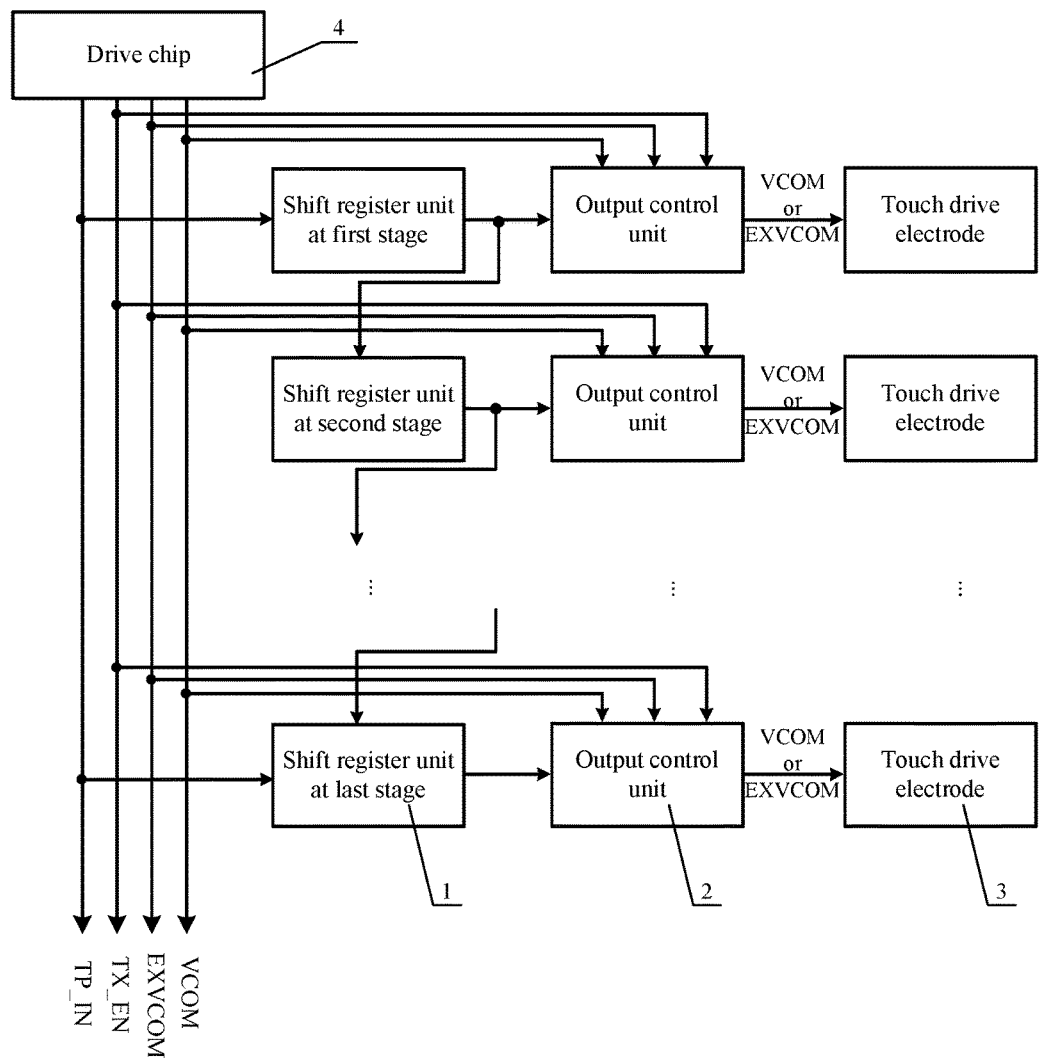
FIG. 1 is a complete structural schematic diagram of a touch drive circuit provided by a first embodiment of the present disclosure.

The embodiment provides a touch drive circuit arranged on an array substrate. As shown in FIG. 1, the touch drive circuit includes a plurality of shift register units 1 mutually cascaded and further includes a plurality of output control units 2; an output terminal of the shift register unit 1 at each stage is connected to a corresponding touch drive electrode 3 through one corresponding output control unit 2, and each touch drive electrode 3 includes one or more common electrodes. Each output control unit 2 receives a touch enable signal TX_EN, a common voltage signal VCOM, a touch scanning signal EXVCOM and an output signal of the shift register unit 1 connected with the output control unit 2, and under the control of the touch enable signal TX_EN and the output signal of the shift register unit 1, outputs the touch scanning signal EXVCOM to the touch drive electrode 3 connected with the output control unit 2 during a first time period, and the first time period is scanning time allocated to the touch drive electrode 3 in one frame of time.

As shown in FIG. 1, when the touch drive circuit of the embodiment operates, the shift register units 1 mutually cascaded are gated stage by stage under the control of a drive chip 4, and when a certain shift register unit 1 is gated, the shift register unit 1 transfers the output signal thereof to the output control unit 2 connected with the shift register unit 1; the output control unit 2 transfers the touch scanning signal EXVCOM to the touch drive electrode 3 connected with the output control unit 2 under the control of the touch enable signal TX_EN and the output signal of the shift register unit 1 connected with the output control unit 2; and thus, when the shift register units 1 mutually cascaded are gated stage by stage under the control of the drive chip 4, progressive scanning of the plurality of touch drive electrodes 3 can be implemented.

From the above, the drive chip 4 only needs to provide control signals to the shift register units 1 and provide the touch enable signal TX_EN, the common voltage signal VCOM and the touch scanning signal EXVCOM to the output control units 2 by a small number of leads so as to implement progressive scanning of the plurality of touch drive electrodes 3; compared with a practice in the prior art that the drive chip needs to respectively output a drive signal to each touch drive electrode through a great number of leads, the number of the leads for the scanning process of the touch drive electrodes is decreased, so that the number of the leads on the edge of a touch display apparatus is decreased, a space occupied by the leads on the edge of the touch display apparatus is reduced, and achievement of a narrow frame is facilitated.

In addition, in the embodiment, each touch drive electrode 3 includes one or more common electrodes; when a certain touch drive electrode 3 is used for achieving a touch function of the touch display apparatus, the touch drive electrode 3 is loaded with the touch scanning signal EXVCOM, and when a certain touch drive electrode 3 is used for achieving a display function of the touch display apparatus, the touch drive electrode 3 is loaded with the common voltage signal VCOM, so that compared with the prior art, the present disclosure saves a step of producing the touch drive electrodes 3 and is beneficial for reducing cost, improving product yield and improving production efficiency.

In order to enable a plurality of touch drive electrodes to be loaded with the touch scanning signal one by one, the shift register units at multiple stages need to be gated stage by stage after receiving an initial shift signal TP_IN; in other words, the TP_IN is a starting signal for the shift register units at multiple stages to operate; and in addition, the TP_IN also can be used as a starting signal of a touch scanning time period. In order to enable the shift register units at multiple stages to have the above described functions, one optional connecting mode of the shift register units at multiple stages is that: an output terminal of the shift register unit at a certain stage is connected with an input terminal of the shift register unit at its next stage, i.e., the output signal of the shift register unit at the certain stage is used as an input signal of the shift register unit at its next stage; and thus, after an input terminal of the shift register unit at a first stage receives the initial shift signal TP_IN, the shift register unit at the first stage is firstly gated, the output signal of the shift register unit at the first stage is transferred to the shift register unit at a second stage, then the shift register unit at the second stage is gated and the like, and the shift register units at the multiple stages are gated stage by stage.

The shift register units of the embodiment further can achieve a bidirectional shifting function. Particularly, the shift register units receive a forward scanning control signal and a reverse scanning control signal, and enter a forward scanning mode or a reverse scanning mode under the control of the forward scanning control signal and the reverse scanning control signal: in the forward scanning mode, after the shift register unit at a first stage receives the initial shift signal, gating is sequentially performed from the shift register unit at the lowest stage to the shift register unit at the highest stage, and in the reverse scanning mode, after the shift register unit at a last stage receives the initial shift signal, gating is sequentially performed from the shift register unit at the highest stage to the shift register unit at the lowest stage, wherein the forward scanning control signal and the reverse scanning control signal are opposite in phase.

In the embodiment, one optional structure of shift register units at multiple stages with the forward/reverse scanning mode is that: a shift register unit at each stage includes a first input terminal and a second input terminal, wherein the first input terminal of the shift register unit at each stage is connected with an output terminal of the shift register unit at its previous stage, and the second input terminal of the shift register unit at each stage is connected with an output terminal of the shift register unit at its next stage. The first input terminal of the shift register unit at the first stage receives the initial shift signal, and the second input terminal of the shift register unit at the last stage receives the initial shift signal. In the forward scanning mode, the shift register units at multiple stages implement forward scanning according to the signals received by the first input terminals of the shift register units; and in the reverse scanning mode, the shift register units at multiple stages implement reverse scanning according to the signals received by the second input terminals of the shift register units.

Figure 2:
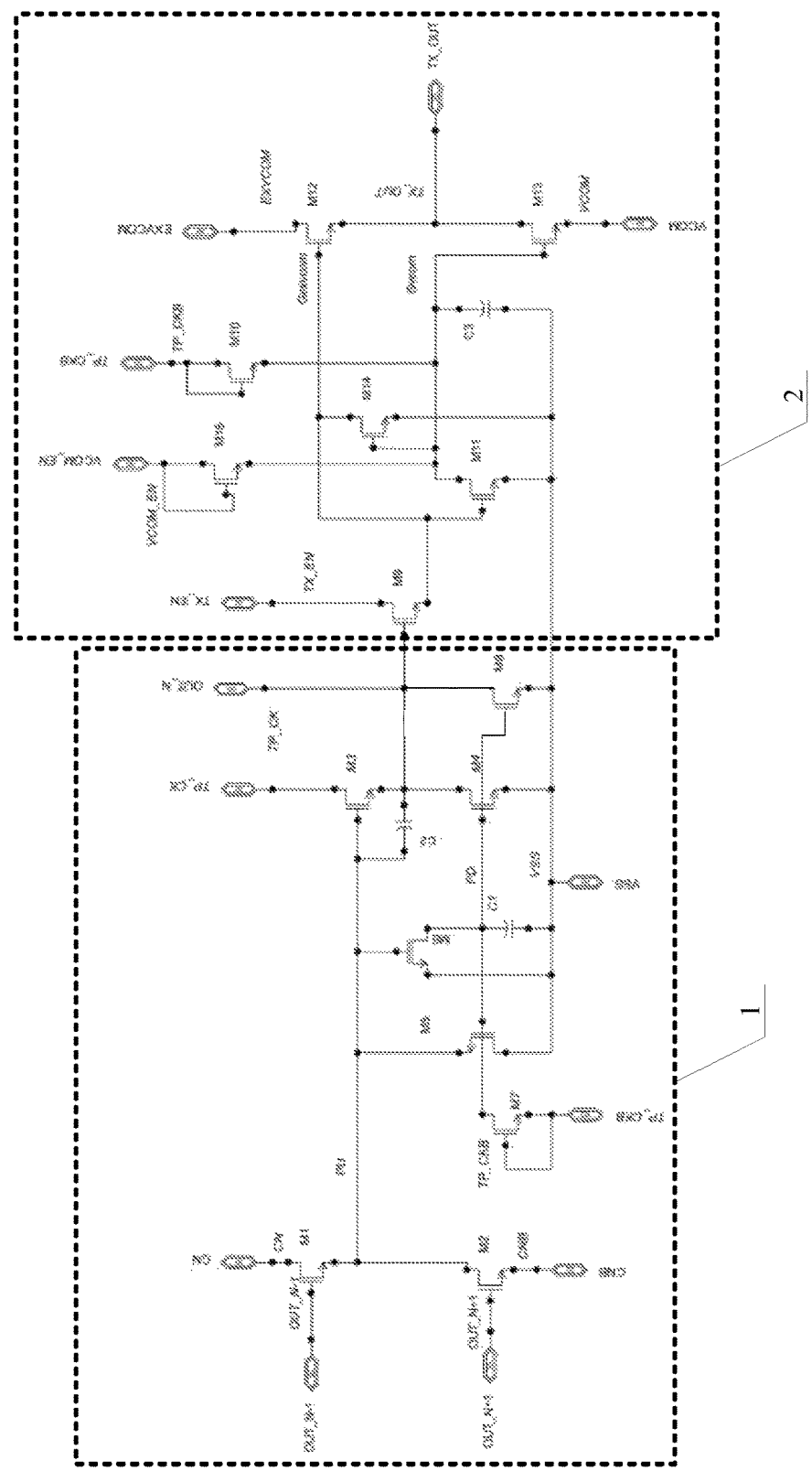
FIG. 2 is a specific structural schematic diagram of the touch drive circuit provided by the first embodiment of the present disclosure.

In order to implement progressive scanning on a plurality of touch drive electrodes and implement time-sharing loading of the touch scanning signal and the common voltage signal to each touch scanning electrode, one optional structure of the touch drive circuit provided by the present disclosure is as shown in FIG. 2, wherein the shift register unit 1 at an m-th stage includes a first field effect transistor M1, of which a gate electrode is connected with an output terminal OUT_N−1 of the shift register unit 1 at an (m−1)-th stage and a source electrode receives the forward scanning control signal CN.

The shift register unit 1 at the m-th stage further includes a second field effect transistor M2, of which a gate electrode is connected with an output terminal OUT_N+1 of the shift register unit at an (m+1)-th stage and a source electrode receives the reverse scanning control signal CNB.

The shift register unit 1 at the m-th stage further includes a third field effect transistor M3, of which a gate electrode is respectively connected with drain electrodes of the first field effect transistor M1 and the second field effect transistor M2 and a drain electrode is connected with an output terminal OUT_IN of the shift register unit at the m-th stage. For the shift register unit 1 at an odd-numbered stage (the shift register unit 1 in FIG. 2 is one shift register unit 1 at an odd-numbered stage, i.e., m is an odd number), a source electrode of the third field effect transistor M3 receives a first clock signal TP_CK; and for the shift register unit 1 at an even-numbered stage, the source electrode of the third field effect transistor M3 receives a second clock signal TP_CKB. The first clock signal TP_CK and the second clock signal TP_CKB are opposite in phase.

The shift register unit 1 at the m-th stage further includes a second capacitor C2, of which a first terminal is connected with the gate electrode of the third field effect transistor M3 and a second terminal is connected with the drain electrode of the third field effect transistor M3.

The shift register unit 1 at the m-th stage further includes a seventh field effect transistor M7, of which a gate electrode and a source electrode simultaneously receive the second clock signal TP_CKB for the shift register unit 1 at the odd-numbered stage (the shift register unit 1 in FIG. 2 is one shift register unit 1 at the odd-numbered stage), and simultaneously receive the first clock signal TP_CK for the shift register unit 1 at the even-numbered stage.

The shift register unit 1 at the m-th stage further includes a fourth field effect transistor M4, of which a gate electrode is connected with a drain electrode of the seventh field effect transistor M7, a source electrode receives a power supply signal VSS and a drain electrode is connected with the output terminal OUT_N of the shift register unit 1 at the present stage.

The shift register unit 1 at the m-th stage further includes a fifth field effect transistor M5, of which a gate electrode is connected with the drain electrode of the seventh field effect transistor M7, a source electrode receives the power supply signal VSS and a drain electrode is connected with the gate electrode of the third field effect transistor M3.

The m is a natural number greater than 1, and as shown in FIG. 1, the gate electrode of the first transistor M1 of the shift register unit 1 at the first stage receives the initial shift signal TP_IN, and the gate electrode of the second transistor M2 of the shift register unit 1 at the last stage receives the initial shift signal TP_IN.

All the plurality of field effect transistors constituting the shift register unit 1 can be N-channel Metal Oxide Semiconductor (NMOS) transistors (hereinafter, the shift register unit consisting of the NMOS transistors are referred to as NMOS-type shift register unit for short), and also can be P-channel Metal Oxide Semiconductor (PMOS) transistors, (hereinafter, the shift register unit consisting of the PMOS transistor are referred to as PMOS-type shift register unit for short), the forward scanning operational principle of the shift register units at the odd-numbered stages is analyzed in the following by taking the case that the shift register units 1 in FIG. 1 are the NMOS-type shift register units as example.

Figure 3:
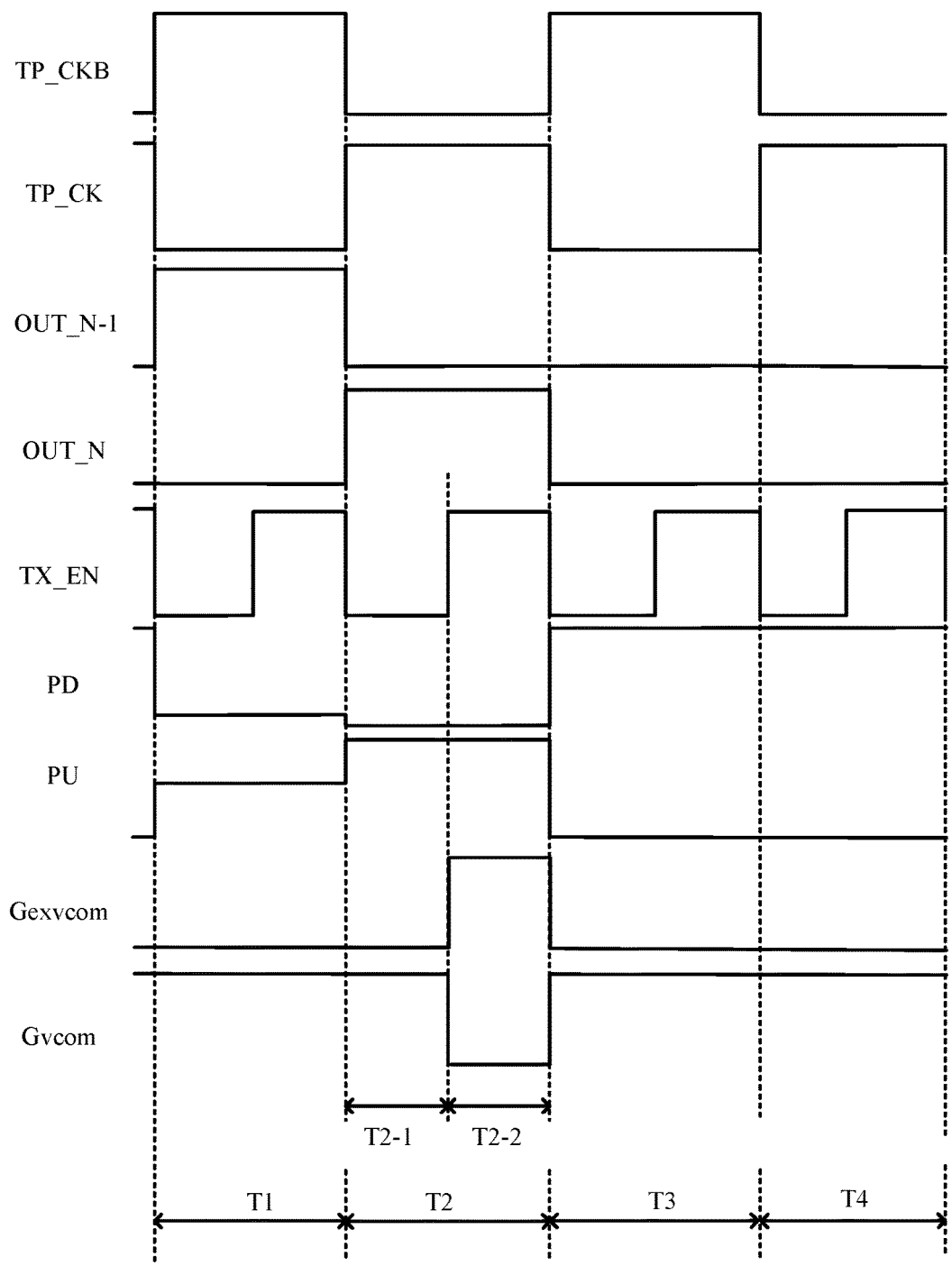
FIG. 3 is a timing sequence diagram of the touch drive circuit provided by the first embodiment of the present disclosure.

As shown in FIG. 2, control signals received by the shift register unit 1 at the m-th stage (m is an odd number) include the power supply signal VSS, the first clock signal TP_CK, the second clock signal TP_CKB, the forward scanning control signal CN and the reverse scanning control signal CNB, wherein the VSS is a low-level signal, the TP_CK and the TP_CKB are periodic signals which are same in pulse width and opposite in phase, the CN is a high-level signal, and the CNB is a low-level signal. As shown in FIG. 3 which is a timing diagram, gating time of the shift register unit at the (m−1)-th stage is T1.

In the time period T1, the output terminal OUT_N−1 of the shift register unit at the (m−1)-th stage is at a high level, then the first field effect transistor M1 is turned on, the CN charges the C2 via the M1, a level of a node PU is pulled up, and the third field effect transistor M3 is turned on. It should be noted that the TP_CKB is at a high level at the moment and the seventh field effect transistor M7 is in a turn-on state, so that the fifth field effect transistor M5 is in a turn-on state, and thus, at the moment, a level value of the node PU is jointly decided by a level value of the CN, a level value of the power supply signal VSS, a source-drain resistance value of the M1 and a source-drain resistance value of the M5. A channel width-to-length ratio of the M1 and a channel width-to-length ratio of the M5 (i.e., the source-drain resistance value of the M1 and the source-drain resistance value of the M5) can be selected, so that the level of the node PU at the moment is at a level enabling the M3 to be turned on.

In other words, in the time period T1, the M3 is turned on, and the TP-CK is at a low level, and thus, the output terminal OUT_N of the shift register unit at the m-th stage outputs a low-level signal.

When the time period T1 is transited to a time period T2, the level of the OUT_N−1 is changed into a low level, and the M1 is turned off; the level of the TP_CKB is changed into a low level, the seventh field effect transistor M7 is turned off, and in the turn-off process of the seventh field effect transistor M7, a level of a node PD is pulled down, and the M5 is turned off; the level of the TP_CK is changed into a high level, and the M3 is turned on, so the output terminal OUT_N of the shift register unit at the m-th stage outputs a high-level signal; and meanwhile, due to a potential holding effect of both terminals of the C2, the level of the node PU is further pulled up (higher than a source level of the M3), and the OUT_N starts to output the high-level signal.

In other words, in the time period T2, the TP_CKB maintains the low level, and the M5 is kept being turned off; and the TP_CK maintains the high level, and the M3 is kept being turned on, so that the OUT_N keeps on outputting the high level.

When the time period T2 is transited to a time period T3, the level of the TP_CKB is changed into a high level, the M7 is turned on, the level of the node PD is pulled up, and the M5 is turned on, so that the level of the node PU is pulled down, the C2 is discharged, and the M3 is turned off; and the fourth field effect transistor M4 is turned on, so that the OUT_N starts to output a low-level signal. In the time period T3, the TP_CKB maintains the high level, the M7 is turned on, the M5 is turned on, the level of the node PU maintains the low level, the M3 is kept in a turn-off state, the M4 is turned on, and the OUT_N maintains the low level.

In other words, after the time period T2, the node PU maintains the low level, the M3 is kept in a turn-off state, and the OUT_N maintains the low level.

From the above, the shift register unit at the m-th stage outputs the high-level signal in the time period T2, i.e., gating time of the shift register unit at the m-th stage is T2, the T2 immediately follows the T1, the length of the T2 is equal to a pulse width of the first clock signal TP_CK, and by similar analysis, it can be derived that the gating time of the shift register unit at the (m+1)-th stage is immediately after the gating time of the shift register unit at the m-th stage, thereby obtaining a conclusion that the shift register units at multiple stages provided by the embodiment can achieve a function of being gated stage by stage.

It should be noted that when the CN is at the high level and the CNB is at the low level, the gating time of the shift register unit at a certain stage is after that of the shift register unit at its previous stage, i.e., the shift register units of multiple stages operate in the forward scanning mode; and when the CN is at the low level and the CNB is at the high level, the gating time of the shift register unit at a certain stage is after that of the shift register unit at its next stage, i.e., the shift register units of multiple stages operate in the reverse scanning mode.

Analysis on the operational principle of the shift register units is carried out for the NMOS-type shift register units, the PMOS-type shift register units have the same circuit structure with the NMOS-type shift register units, and only by correspondingly changing positivity and negativity of the control signals, the same conclusion, i.e., the shift register units at multiple stages provided by the embodiment can achieve the function of being gated stage by stage, can be obtained.

In order to improve quality of the output signals of the shift register units 1, as shown in FIG. 2, besides the first field effect transistor M1, the second field effect transistor M2, the third field effect transistor M3, the fourth field effect transistor M4, the fifth field effect transistor M5, the seventh field effect transistor M7 and the second capacitor C2, the shift register unit 1 at the m-th stage further includes: a first capacitor C1, of which a first terminal is connected with the drain electrode of the seventh field effect transistor M7 and a second terminal receives the power supply signal VSS; a sixth field effect transistor M6, of which a gate electrode is connected with the gate electrode of the third field effect transistor M3, a source electrode receives the power supply signal VSS and a drain electrode is connected with the first terminal of the first capacitor C1; and an eighth field effect transistor M8, of which a gate electrode is connected with the first terminal of the first capacitor C1, a source electrode receives the power supply signal VSS and a drain electrode is connected with the output terminal OUT_N of the shift register unit 1 at the m-th stage.

The advantageous effects brought by the C1, the M5 and the M8 will be illustrated in the following in connection with a specific example. In the specific example, as shown in FIG. 2, the shift register unit 1 is an NMOS-type shift register unit 1 at an odd-numbered stage, the forward scanning control signal CN is at the high level, the reverse scanning control signal CNB is at the low level, waveforms of the first clock signal TP_CK and the second clock signal TP_CKB are as shown in FIG. 3, and the first clock signal TP_CK and the second clock signal TP_CKB are periodic pulse signals which are same in pulse width and opposite in phase. With reference to FIG. 2 and FIG. 3, when the TP_CKB is at the high level, the C1 will be charged by the M7, so that before the time period T1 and after the time period T2, a high level difference is kept across both terminals of the C1, and thus, the node PD maintains the high level and the M4 and the M5 are kept in the turn-on state, wherein the M4 is in the turn-on state to maintain the low level of the OUT_N, and the M5 is in the turn-on state to maintain the low level of the node PU, so that the M3 is in the turn-off state and the low level of the OUT_N is further guaranteed not to be interfered, and thus, the C1 can avoid influence of a noise signal on the shift register unit 1 during the above-described time period such that the shift register unit 1 can stably output the low-level signal during the above-described time period.

With further reference to FIG. 2 and FIG. 3, during the time period T1, the output terminal OUT_N−1 of the shift register unit at the previous stage is at the high level, then the first field effect transistor M1 is turned on and the CN charges the C2 by the M1, so that the level of the node PU is pulled up and the third field effect transistor M3 is turned on; and the M6 is turned on and the VSS enables the C1 to be discharged by the M6, so that the level of the node PD is pulled down and the source-drain resistance value of the M5 is increased, and thus, the M6 can enable the node PU to reach a relatively high level value.

With further reference to FIG. 2 and FIG. 3, when the time period T1 is transited to the time period T2, the level of the OUT_N−1 is changed into a low level, and the M1 is turned off; the level of the TP_CKB is changed into a low level, the seventh field effect transistor M7 is turned off, and the M5 is turned off; the level of the TP_CK is changed into a high level, and the M3 is turned on, so the output terminal OUT_N of the shift register unit at the m-th stage outputs the high-level signal; and meanwhile, due to the potential holding effect across both terminals of the C2, the level of the node PU is further pulled up (higher than the source level of the M3), and the output terminal OUT_N of the shift register unit 1 starts to output the high-level signal.

With further reference to FIG. 2 and FIG. 3, during the time period T2, the TP_CKB maintains the low level, and the M5 is kept being turned off; and the TP_CK maintains the high level, and the M3 is kept in the turn-on state, so that the OUT_N keeps on outputting the high level.

With further reference to FIG. 2 and FIG. 3, when the time period T2 is transited to the time period T3, the level of the TP_CKB is changed into a high level, the M7 is turned on, the level of the node PD is pulled up, the C1 is charged, and the M5, the M4 and the M8 are turned on; wherein the M5 is turned on, the level of the node PU is pulled down, the C2 is discharged, and the M3 and the M6 are turned off; wherein the M4 and the M8 are turned on, so that the OUT_N starts to output the low-level signal. Existence of the M8 can reduce a resistance value between the VSS and the OUT_N so as to reduce a level value at the OUT_N when the OUT_N outputs the low level, and improve anti-interference capacity of the output signal of the shift register unit 1. During the time period T3, the TP_CKB maintains the high level, the M7 is turned on, the M5 is turned on, the level of the node PU maintains the low level, the M3 is kept in the turn-off state, the M4 and the M8 are turned on, and the OUT_N maintains the low level.

When the time period T3 is transited to a time period T4, the level of the TP_CKB is changed into a low level, the M7 is turned off, the node PD maintains the high level due to the potential holding effect across both terminals of the capacitor C1, the M5 is turned on, the node PU is kept having a low level, the M3 is kept in the turn-off state, the M4 and the M8 are turned on, and the OUT_N maintains a low level.

Later, operations in the time period T3 and the time period T4 are repeated until the level of the OUT_N−1 is at a high level again.

It is worth mentioning that the above analysis aims at the shift register units 1 at the odd-numbered stages, and for the shift register units 1 at even-numbered stages, the C1, the M6 and the M8 can bring the same advantageous effects which can be obtained by those skilled in the art through similar analysis and are not repeated herein.

In order to implement progressive scanning on a plurality of touch drive electrodes and implement time-sharing loading of the touch scanning signal and the common voltage signal to respective touch scanning electrodes, one optional structure of the touch drive circuit provided by the embodiment is as shown in FIG. 2, wherein the shift register unit 1 includes: the M1, the M2, the M3, the M4, the M5, the M6, the M7, the M8, the C1 and the C2, and the output control unit 2 includes: a ninth field effect transistor M9, of which a gate electrode receives the output signal OUT_N of the shift register unit 1 connected with the output control unit 2 and a source electrode receives the touch enable signal TX-EN; a twelfth field effect transistor M12, of which a gate electrode is connected with a drain electrode of the ninth field effect transistor M9, a source electrode receives the touch scanning signal EXVCOM and a drain electrode is connected to the output terminal TX_OUT of the output control unit 2; an eleventh field effect transistor M11, of which a gate electrode is connected with the drain electrode of the ninth field effect transistor M9 and a source electrode receives the power supply signal VSS; a thirteenth field effect transistor M13, of which a gate electrode is connected with a drain electrode of the eleventh field effect transistor M11, a source electrode receives the common voltage signal VCOM and a drain electrode is connected to the output terminal TX_OUT of the output control unit 2; a fourteenth field effect transistor M14, of which a gate electrode is connected with the drain electrode of the eleventh field effect transistor M11, a source electrode is connected with the power supply signal VSS and a drain electrode is connected with the gate electrode of the twelfth field effect transistor M12; and a tenth field effect transistor M10, of which a drain electrode is connected with the gate electrode of the thirteenth field effect transistor M13, and a gate electrode and a source electrode simultaneously receive the second clock signal TP_CKB for the output control unit 2 at an odd-numbered stage and simultaneously receive the first clock signal TP_CK for the output control unit 2 at an even-numbered stage, wherein the output control unit 2 at the odd-numbered stage means that the stage number of the shift register unit 1 connected with the output control unit 2 is an odd number.

Functions of the output control units 2 adopting the above structure will be illustrated in the following in connection with a specific example. In the specific example, as shown in FIG. 2, the stage number of the shift register unit 1 is an odd number, all the field effect transistors constituting the shift register unit 1 and the output control unit 2 are the NMOS transistors, the forward scanning control signal CN is at a high level, the reverse scanning control signal CNB is at a low level, the common voltage signal VCOM is a direct current signal, the touch scanning signal EXVCOM is an alternating current signal, the waveforms of the first clock signal TP_CK and the second clock signal TP_CKB are as shown in FIG. 3, the first clock signal TP_CK and the second clock signal TP_CKB are periodic pulse signals which are same in pulse width and opposite in phase, the touch enable signal TX_EN is a periodic pulse signal, and a signal period of the touch enable signal TX_EN is half a signal period of the TP_CK. As shown in FIG. 3, the gating time of the shift register unit 1 is T2, i.e., the OUT_N is at the high level during the time period T2.

With reference to FIG. 2 and FIG. 3, during a time period T2-1, the OUT_N is at a high level, the TX_EN is at a low level, the M9 is turned on, and the M11 is in the turn-off state; the TP_CKB is at a low level, and the M10 is in the turn-off state; a point Gexvcom is at a low level and a point Gvcom is at a high level, so that the M12 is turned off, the M13 and the M14 are turned on, and the VCOM is loaded to the TX_OUT by the M13. During a time period T2-2, the OUT_N is at a high level, the TX_EN is at a high level, the M11 is turned on, the M14 is turned off, the level of the point Gexvcom is changed into a high level and the level of the point Gvcom is changed into a low level, so that the M13 is turned off, the M12 is turned on and the EXVCOM is output to the TX_OUT by the M12. When the time period T2-2 is transited to the time period 13, the level of the OUT_N is changed into a low level, the M9 is turned off, the level of the TP_CKB is changed into a high level, the M10 is turned on, the point Gvcom is pulled up to a high level, the M14 is turned on, and the point Gexvcom is pulled down to a low level; and the M13 is turned on, and the VCOM is output to the TX_OUT by the M13. After the time period T2-2, e.g., in the time period T3 and the time period 14, the M11 is in the turn-off state, the point Gvcom maintains a relatively high potential, so that the TX_OUT continuously outputs the VCOM.

To sum up, under the control of the touch enable signal TX_EN, the first clock signal TP_CK, the second clock signal TP_CKB and the output signal of the shift register unit 1 connected with the output control unit 2, the output control unit 2 connected with the shift register unit 1 at an odd-numbered stage outputs the touch scanning signal EXV-COM to the touch drive electrode 3 connected with the output control unit 2 in the first time period (T2-1), and output the common voltage signal VCOM to the touch drive electrode 3 connected with the output control unit 2 in other time periods of one frame. Those skilled in the art can know by similar analysis that the output control unit 2 connected with the shift register unit 1 at an even-numbered stage can achieve the same functions, which is not repeated herein.

Preferably, as shown in FIG. 2, besides the ninth field effect transistor M9, the tenth field effect transistor M10, the eleventh field effect transistor M11, the twelfth field effect transistor M12, the thirteenth field effect transistor M13 and the fourteenth field effect transistor M14, the output control unit 2 further includes: a sixteenth field effect transistor M16, of which a gate electrode and a source electrode receive a common voltage enable signal VCOM_EN and a drain electrode is connected with the gate electrode of the thirteenth field effect transistor M13; and a third capacitor C3, of which a first terminal is connected with a drain electrode of the eleventh field effect transistor M11 and a second terminal receives the power supply signal VSS.

Functions of the C3 and the M16 will be illustrated in the following in connection with a specific example. In the specific example, as shown in FIG. 2, the stage number of the shift register unit 1 is an odd number, all the field effect transistors constituting the shift register unit 1 and the output control unit 2 are the NMOS transistors, the forward scanning control signal CN is at a high level, the reverse scanning control signal CNB is at a low level, the common voltage signal VCOM is a direct current signal, the touch scanning signal EXVCOM is an alternating current signal, the waveforms of the first clock signal TP_CK and the second clock signal TP_CKB are as shown in FIG. 3, the first clock signal TP_CK and the second clock signal TP_CKB are periodic pulse signals which are same in pulse width and opposite in phase, the touch enable signal TX_EN is a periodic pulse signal, and a signal period of the touch enable signal TX_EN is half the signal period of the TP_CK. As shown in FIG. 3, the gating time of the shift register unit 1 is T2, i.e., the OUT_N is at a high level during the time period T2.

With reference to FIG. 2 and FIG. 3, before the time period T2 and after the time period T2, when the TP_CKB is at a high level, the M10 is turned on, the TP_CKB charges the C3 by the M10, and by the holding effect on a potential difference across both terminals of the C3, the point Gvcom maintains a high level and the M13 is kept in the turn-on state, so that influence of the noise signal on the level of the point Gvcom is reduced and the TX_OUT stably outputs the VCOM.

With further reference to FIG. 2 and FIG. 3, when the VCOM_EN signal is at a high level, the M16 is turned on, the point Gvcom is at a high level, the M13 is turned on, the VCOM is output to the TX_OUT by the M13, simultaneously, the M14 is turned on, and the point Gexvcom is at a low level, so that the M12 is turned off. Therefore, by controlling the level of the VCOM_EN, the TX_OUT can be directly controlled to output the VCOM, so that the touch display apparatus is compatible to a display mode. For the output control unit 2 connected with the shift register unit 1 at the even-numbered stage, the C3 and the M16 can bring the same effects, and those skilled in the art can obtain the conclusion by similar analysis, which is not repeated herein.

According to the touch drive circuit as shown in FIG. 2, all the field effect transistors can be the N-type MOS transistors, and also can be the P-type MOS transistor, which are not defined in the embodiment. The foregoing introduces the structure and the operational principle of the NMOS-type touch drive circuit in details, and the power supply signal VSS in the control signals is a low-level signal; and it is well known that the NMOS circuit and the PMOS circuit can be mutually converted, only the N-type MOST transistors in the circuit need to be changed into the P-type MOS transistors and the control signals of the circuit are correspondingly changed, and particularly in the embodiment, when the field effect transistors in the touch drive circuit are the P-type MOS transistors, the power supply signal VSS should be regulated into a high-level signal. It is worth mentioning that the NMOS-type touch drive circuit and the PMOS-type touch drive circuit are simple in production process and can save manufacturing cost, improve product yield and improve production efficiency. For example, with respect to a Complementary Metal-Oxide-Semiconductor Transistor (CMOS) type touch drive circuit, the NMOS-type touch drive circuit can save a process of producing a hole injection region.

To sum up, by adopting the touch drive circuit provided by the embodiment, the number of the leads for driving the touch drive electrodes can be decreased, and the touch display apparatus is facilitated achieving the narrow frame.

Second Embodiment

In the embodiments of the present disclosure, there is further provided a driving method for driving the touch drive circuit provided by the first embodiment. The driving method includes: during touch scanning time period in one frame, by each of output control units, receiving a touch enable signal, a common voltage signal and a touch scanning signal, and receiving an output signal of shift register unit connected with the output control unit; and outputting, by each of the output control units, the touch scanning signal to a touch drive electrode connected with the output control unit in a first time period according to the touch enable signal and the output signal of the shift register unit connected with the output control unit, wherein the first time period is scanning time allocated to the touch drive electrode in one frame of time.

In the driving method for the touch drive circuit, during the touch scanning time period, the shift register units further receive an initial shift signal and are gated stage by stage after receiving the initial shift signal.

In the driving method for the touch drive circuit, during the touch scanning time period, the shift register units also receive a forward scanning control signal and a reverse scanning control signal, and enter a forward scanning mode or a reverse scanning mode under the control of the forward scanning control signal and the reverse scanning control signal: in the forward scanning mode, after the shift register unit at a first stage receives the initial shift signal, gating is sequentially performed from the shift register unit at the lowest stage to the shift register unit at the highest stage; and in the reverse scanning mode, after the shift register unit at a last stage receives the initial shift signal, gating is sequentially performed from the shift register unit at the highest stage to the shift register unit at the lowest stage. By the shift register units with the forward and reverse scanning modes, functions of the touch drive circuit can be more flexibly achieved.

All the embodiments in the description are described in a progressive manner, the same and similar parts among all the embodiments can refer to each other, and each embodiment focuses on description of differences from other embodiments. Particularly, the method embodiment is basically similar with the apparatus embodiment, so the description of the method embodiment is relatively simple, and related parts can refer to part of description of the method embodiment.

Third Embodiment

In the embodiment of the present disclosure, there is further provided an array substrate including any one of the touch drive circuits provided by the first embodiment. In the embodiment of the present disclosure, there is further provided a touch display apparatus, and the touch display apparatus is provided with the array substrate. Exemplarily, the touch display apparatus in the embodiment of the present disclosure is a capacitive type touch display screen.

The touch drive circuit provided by the first embodiment is arranged on the touch display apparatus in the embodiment of the present disclosure, and compared to the prior art, the touch display apparatus in the embodiment of the present disclosure is easier to achieve a narrow frame.

The above merely are specific embodiments of the present disclosure, but not intended to define the scope of the present disclosure. Any variations or replacements capable of being easily thought by those skilled in the art shall fall within the scope of the present disclosure. Thus, the scope of the present disclosure shall be determined by the scope of the claims.

The present application claims priority of the Chinese Patent Application No. 201510280372.9 filed on May 27, 2015, entitled 'TOUCH DRIVE CIRCUIT AND DRIVING METHOD THEREFOR, ARRAY SUBSTRATE AND TOUCH DISPLAY APPARATUS', the entire contents of which are incorporated herein by reference.

The invention claimed is:

1. A touch drive circuit, comprising a plurality of shift register units mutually cascaded and a plurality of output control units,
wherein an output terminal of the shift register unit at each stage is connected to a corresponding touch drive electrode through one corresponding output control unit in the plurality of output control units, and each touch drive electrode includes one or more common electrodes; and
each of the output control units receives a touch enable signal, a common voltage signal, a touch scanning signal and an output signal of the shift register unit connected with the output control unit, and under the control of the touch enable signal and the output signal, outputs the touch scanning signal to the touch drive electrode connected with the output control unit during a first time period, and the first time period is scanning time allocated to the touch drive electrode in one frame of time,
wherein the shift register unit at an m-th stage includes:
a first field effect transistor, of which a gate electrode is connected with an output terminal of the shift register unit at an (m−1)-th stage and a source electrode receives the forward scanning control signal;
a second field effect transistor, of which a gate electrode is connected with an output terminal of the shift register unit at an (m+1)-th stage and a source electrode receives the reverse scanning control signal;
a third field effect transistor, of which a gate electrode is respectively connected with drain electrodes of the first field effect transistor and the second field effect transistor, a drain electrode is connected with an output terminal of the shift register unit at the m-th stage, a source electrode receives a first clock signal for the shift register unit at an odd-numbered stage and a source electrode receives a second clock signal for the shift register unit at an even-numbered stage, wherein the first clock signal and the second clock signal are opposite in phase;
a second capacitor, of which a first terminal is connected with the gate electrode of the third field effect transistor and a second terminal is connected with the drain electrode of the third field effect transistor; and
a pull-down circuit, which is connected with the output terminal of the shift register unit at the m-th stage, the gate electrode of the third field effect transistor and a power supply signal terminal and is used for connecting the output terminal of the shift register unit at the m-th stage and the gate electrode of the third field effect transistor to the power supply signal terminal when the shift register unit of the m-th stage does not output a gate line drive signal,
wherein m is a natural number greater than 1.

2. The touch drive circuit according to claim 1, wherein after a shift register unit in the plurality of shift register units mutually cascaded, which is to receive an initial shift signal, receives the initial shift signal, the plurality of shift register units mutually cascaded are gated stage by stage.

3. The touch drive circuit according to claim 2, wherein the shift register units receive a forward scanning control signal and a reverse scanning control signal, and enter a forward scanning mode or a reverse scanning mode under the control of the forward scanning control signal and the reverse scanning control signal;
in the forward scanning mode, after the shift register unit at a first stage receives the initial shift signal, gating is sequentially performed from the shift register unit at the lowest stage to the shift register unit at the highest stage;
in the reverse scanning mode, after the shift register unit at a last stage receives the initial shift signal, gating is sequentially performed from the shift register unit at the highest stage to the shift register unit at the lowest stage; and
the forward scanning control signal and the reverse scanning control signal are opposite in phase.

4. The touch drive circuit according to claim 1, wherein the pull-down circuit includes:
a seventh field effect transistor, of which a gate electrode and a source electrode simultaneously receive the second clock signal for the shift register unit at the odd-numbered stage, and simultaneously receive the first clock signal for the shift register unit at the even-numbered stage;
a fourth field effect transistor, of which a gate electrode is connected with a drain electrode of the seventh field effect transistor, a source electrode receives a power supply signal of the power supply signal terminal and a drain electrode is connected with an output terminal of the shift register unit at the present stage; and a fifth field effect transistor, of which a gate electrode is connected with the drain electrode of the seventh field effect transistor, a source electrode receives the power supply signal and a drain electrode is connected with the gate electrode of the third field effect transistor.

5. The touch drive circuit according to claim 1, wherein the shift register unit at the m-th stage further includes:
a first capacitor, of which a first terminal is connected with the drain electrode of the seventh field effect transistor and a second terminal receives the power supply signal;
a sixth field effect transistor, of which a gate electrode is connected with the gate electrode of the third field effect transistor, a source electrode receives the power supply signal and a drain electrode is connected with the first terminal of the first capacitor; and
an eighth field effect transistor, of which a gate electrode is connected with the first terminal of the first capacitor, a source electrode receives the power supply signal and a drain electrode is connected with the output terminal of the shift register unit at the m-th stage.

6. The touch drive circuit according to claim 1, wherein the output control unit includes:
a ninth field effect transistor, of which a gate electrode receives the output signal of the shift register unit connected with the output control unit and a source electrode receives the touch enable signal;
a twelfth field effect transistor, of which a gate electrode is connected with a drain electrode of the ninth field effect transistor, a source electrode receives the touch scanning signal and a drain electrode is connected to an output terminal of the output control unit;
an eleventh field effect transistor, of which a gate electrode is connected with the drain electrode of the ninth field effect transistor and a source electrode receives the power supply signal;
a thirteenth field effect transistor, of which a gate electrode is connected with a drain electrode of the eleventh field effect transistor, a source electrode receives the common voltage signal and a drain electrode is connected to the output terminal of the output control unit;
a fourteenth field effect transistor, of which a gate electrode is connected with the drain electrode of the eleventh field effect transistor, a source electrode is connected with the power supply signal and a drain electrode is connected with the gate electrode of the twelfth field effect transistor; and
a tenth field effect transistor, of which a drain electrode is connected with the gate electrode of the thirteenth field effect transistor, and a gate electrode and a source electrode simultaneously receive the second clock signal for the output control unit at an odd-numbered stage and simultaneously receive the first clock signal for the output control unit at an even-numbered stage.

7. The touch drive circuit according to claim 6, wherein the output control unit further includes:
a sixteenth field effect transistor, of which a gate electrode and a source electrode receive a common voltage enable signal and a drain electrode is connected with the gate electrode of the thirteenth field effect transistor; and
a third capacitor, of which a first terminal is connected with a drain electrode of the eleventh field effect transistor and a second terminal receives the power supply signal.

8. The touch drive circuit according to claim 7, wherein the field effect transistors are N-type or P-type Metal Oxide Semiconductor (MOS) transistors;

when the field effect transistors are the N-type MOS transistors, the power supply signal is a low-level signal; and
when the field effect transistors are the P-type MOS transistors, the power supply signal is a high-level signal.

9. An array substrate, comprising the touch drive circuit according to claim 1.

10. The array substrate according to claim 9, wherein after a shift register unit in the plurality of shift register units mutually cascaded, which is to receive an initial shift signal, receives the initial shift signal, the plurality of shift register units mutually cascaded are gated stage by stage.

11. The array substrate according to claim 10, wherein the shift register units receive a forward scanning control signal and a reverse scanning control signal, and enter a forward scanning mode or a reverse scanning mode under the control of the forward scanning control signal and the reverse scanning control signal;
in the forward scanning mode, after the shift register unit at a first stage receives the initial shift signal, gating is sequentially performed from the shift register unit at the lowest stage to the shift register unit at the highest stage;
in the reverse scanning mode, after the shift register unit at a last stage receives the initial shift signal, gating is sequentially performed from the shift register unit at the highest stage to the shift register unit at the lowest stage; and
the forward scanning control signal and the reverse scanning control signal are opposite in phase.

12. A driving method for a touch drive circuit, including a plurality of shift register units, mutually cascaded and a plurality of output control units,
wherein an output terminal of the shift register unit at each stage is connected to a corresponding touch drive electrode through one corresponding output control unit in the plurality of output control units, and each touch drive electrode includes one or more common electrodes; and
each of the output control units receives a touch enable signal, a common voltage signal, a touch scanning signal and an output signal of the shift register unit connected with the output control unit, and under the control of the touch enable signal and the output signal, outputs the touch scanning signal to the touch drive electrode connected with the output control unit during a first time period, and the first time period is scanning time allocated to the touch drive electrode in one frame of time,
wherein the shift register unit at an m-th stage includes:
a first field effect transistor, of which a gate electrode is connected with an output terminal of the shift register unit at an (m−1)-th stage and a source electrode receives the forward scanning control signal;
a second field effect transistor, of which a gate electrode is connected with an output terminal of the shift register unit at an (m+1)-th stage and a source electrode receives the reverse scanning control signal;
a third field effect transistor, of which a gate electrode is respectively connected with drain electrodes of the first field effect transistor and the second field effect transistor, a drain electrode is connected with an output terminal of the shift register unit at the m-th stage, a source electrode receives a first clock signal for the shift register unit at an odd-numbered stage and a source electrode receives a second clock signal for the shift register unit at an even-numbered stage, wherein the first clock signal and the second clock signal are opposite in phase;

a second capacitor, of which a first terminal is connected with the gate electrode of the third field effect transistor and a second terminal is connected with the drain electrode of the third field effect transistor; and a pull-down circuit, which is connected with the output terminal of the shift register unit at the m-th stage, the gate electrode of the third field effect transistor and a power supply signal terminal and is used for connecting the output terminal of the shift register unit at the m-th stage and the gate electrode of the third field effect transistor to the power supply signal terminal when the shift register unit of the m-th stage does not output a gate line drive signal, wherein m is a natural number greater than 1, wherein the driving method comprises:

during touch scanning time period in one frame, by each of the output control units, receiving the touch enable signal, the common voltage signal and the touch scanning signal, and receiving an output signal of the shift register unit connected with the output control unit; and outputting, by each of the output control units, the touch scanning signal to the touch drive electrode connected with the output control unit in a first time period according to the touch enable signal and the output signal, wherein the first time period is scanning time allocated to the touch drive electrode in one frame of time.

13. The driving method according to claim 12, wherein during the touch scanning time period, the shift register unit in the plurality of shift register units mutually cascaded, which is to receive an initial shift signal, receives the initial shift signal, and after the shift register unit receives the initial shift signal, the plurality of shift register units mutually cascaded are gated stage by stage.

14. The driving method according to claim 13, wherein during the touch scanning time period, each of the shift register units further receives a forward scanning control signal and a reverse scanning control signal, and enters a forward scanning mode or a reverse scanning mode under the control of the forward scanning control signal and the reverse scanning control signal;

in the forward scanning mode, after the shift register unit at a first stage receives the initial shift signal, gating is sequentially performed from the shift register unit at the lowest stage to the shift register unit at the highest stage; and in the reverse scanning mode, after the shift register unit at a last stage receives the initial shift signal, gating is sequentially performed from the shift register unit at the highest stage to the shift register unit at the lowest stage.

15. The driving method according to claim 13, wherein the pull-down circuit includes:

a seventh field effect transistor, of which a gate electrode and a source electrode simultaneously receive the second clock signal for the shift register unit at the odd-numbered stage, and simultaneously receive the first clock signal for the shift register unit at the even-numbered stage;

a fourth field effect transistor, of which a gate electrode is connected with a drain electrode of the seventh field effect transistor, a source electrode receives a power supply signal of the power supply signal terminal and a drain electrode is connected with an output terminal of the shift register unit at the present stage; and a fifth field effect transistor, of which a gate electrode is connected with the drain electrode of the seventh field effect transistor, a source electrode receives the power supply signal and a drain electrode is connected with the gate electrode of the third field effect transistor.

16. The driving method according to claim 13, wherein the shift register unit at the m-th stage further includes:

a first capacitor, of which a first terminal is connected with the drain electrode of the seventh field effect transistor and a second terminal receives the power supply signal;

a sixth field effect transistor, of which a gate electrode is connected with the gate electrode of the third field effect transistor, a source electrode receives the power supply signal and a drain electrode is connected with the first terminal of the first capacitor; and an eighth field effect transistor, of which a gate electrode is connected with the first terminal of the first capacitor, a source electrode receives the power supply signal and a drain electrode is connected with the output terminal of the shift register unit at the m-th stage.

17. The driving method according to claim 13, wherein the output control unit includes:

a ninth field effect transistor, of which a gate electrode receives the output signal of the shift register unit connected with the output control unit and a source electrode receives the touch enable signal;

a twelfth field effect transistor, of which a gate electrode is connected with a drain electrode of the ninth field effect transistor, a source electrode receives the touch scanning signal and a drain electrode is connected to an output terminal of the output control unit;

an eleventh field effect transistor, of which a gate electrode is connected with the drain electrode of the ninth field effect transistor and a source electrode receives the power supply signal;

a thirteenth field effect transistor, of which a gate electrode is connected with a drain electrode of the eleventh field effect transistor, a source electrode receives the common voltage signal and a drain electrode is connected to the output terminal of the output control unit;

a fourteenth field effect transistor, of which a gate electrode is connected with the drain electrode of the eleventh field effect transistor, a source electrode is connected with the power supply signal and a drain electrode is connected with the gate electrode of the twelfth field effect transistor; and a tenth field effect transistor, of which a drain electrode is connected with the gate electrode of the thirteenth field effect transistor, and a gate electrode and a source electrode simultaneously receive the second clock signal for the output control unit at an odd-numbered stage and simultaneously receive the first clock signal for the output control unit at an even-numbered stage.

18. The driving method according to claim 17, wherein the output control unit further includes:

a sixteenth field effect transistor, of which a gate electrode and a source electrode receive a common voltage enable signal and a drain electrode is connected with the gate electrode of the thirteenth field effect transistor; and a third capacitor, of which a first terminal is connected with a drain electrode of the eleventh field effect transistor and a second terminal receives the power supply signal.

* * * * *